US012574008B2

(12) United States Patent
Mimura et al.

(10) Patent No.: US 12,574,008 B2
(45) Date of Patent: Mar. 10, 2026

(54) ACOUSTIC WAVE DEVICE WITH AN IDT ELECTRODE INCLUDING AN OUTER LAYER

(71) Applicant: Murata Manufacturing Co., Ltd., Nagaokakyo (JP)

(72) Inventors: Masakazu Mimura, Nagaokakyo (JP); Soichiro Tegawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 768 days.

(21) Appl. No.: 17/987,933

(22) Filed: Nov. 16, 2022

(65) Prior Publication Data

US 2023/0076316 A1 Mar. 9, 2023

Related U.S. Application Data

(63) Continuation of application No. PCT/JP2021/019339, filed on May 21, 2021.

(30) Foreign Application Priority Data

May 28, 2020 (JP) ................................. 2020-093436

(51) Int. Cl.
*H03H 9/25* (2006.01)
(52) U.S. Cl.
CPC ..................................... *H03H 9/25* (2013.01)
(58) Field of Classification Search
CPC .. H03H 9/25; H03H 9/02228; H03H 9/02574; H03H 9/131; H03H 9/174; H03H 9/14541
See application file for complete search history.

(56) References Cited

U.S. PATENT DOCUMENTS

| | | | | |
|---|---|---|---|---|
| 10,763,813 B2 * | 9/2020 | Nakamura | ............ | G01L 9/0025 |
| 2006/0076851 A1 | 4/2006 | Fujimoto et al. | | |

(Continued)

FOREIGN PATENT DOCUMENTS

| | | |
|---|---|---|
| CN | 101145767 A | 3/2008 |
| CN | 103262410 A | 8/2013 |

(Continued)

OTHER PUBLICATIONS

International Search Report in PCT/JP2021/019339, mailed Aug. 3, 2021, 3 pages.

(Continued)

*Primary Examiner* — Emily P Pham
(74) *Attorney, Agent, or Firm* — Keating & Bennett, LLP

(57) ABSTRACT

An acoustic wave device includes a piezoelectric substrate and an IDT electrode including electrode fingers, a barrier layer on the piezoelectric substrate, and a first layer on the barrier layer, and including Cu as a main component. The first layer includes a first principal surface on a side closest to the piezoelectric substrate, a second principal surface opposite to the first principal surface, and a side surface connected to the first principal surface and the second principal surface. The barrier layer covers the first principal surface 5*a* and the side surface of the first layer. A thickness of a portion of the barrier layer covering the first principal surface of the first layer is smaller than a thickness of a portion of the barrier layer covering the side surface of the first layer.

20 Claims, 6 Drawing Sheets

(56) References Cited

U.S. PATENT DOCUMENTS

| | | | |
|---|---|---|---|
| 2006/0175639 | A1 | 8/2006 | Leidl et al. |
| 2008/0061657 | A1 | 3/2008 | Matsuda et al. |
| 2010/0187493 | A1 | 7/2010 | Takahashi |
| 2013/0285768 | A1 | 10/2013 | Watanabe et al. |
| 2015/0033521 | A1 | 2/2015 | Watanabe et al. |
| 2017/0250335 | A1 | 8/2017 | Taniguchi |
| 2021/0305487 | A1* | 9/2021 | Li .......................... H10N 30/05 |

FOREIGN PATENT DOCUMENTS

| | | | |
|---|---|---|---|
| JP | 2004289441 | A | 10/2004 |
| JP | 2005518127 | A | 6/2005 |
| JP | 2006109287 | A | 4/2006 |
| JP | 2008067289 | A | 3/2008 |
| JP | 2010177393 | A | 8/2010 |
| JP | 2017157944 | A | 9/2017 |
| JP | 2018050135 | A | 3/2018 |
| JP | 2019068309 | A | 4/2019 |
| WO | 2012086639 | A1 | 6/2012 |

OTHER PUBLICATIONS

Written Opinion in PCT/JP2021/019339, mailed Aug. 3, 2021, 4 pages.
Official Communication issued in corresponding Chinese Patent Application No. 202180037234.1, mailed on May 9, 2025, 8 pages.

\* cited by examiner

ACOUSTIC WAVE DEVICE WITH AN IDT ELECTRODE INCLUDING AN OUTER LAYER

CROSS REFERENCE TO RELATED APPLICATIONS

This application claims the benefit of priority to Japanese Patent Application No. 2020-093436 filed on May 28, 2020 and is a Continuation Application of PCT Application No. PCT/JP2021/019339 filed on May 21, 2021. The entire contents of each application are hereby incorporated herein by reference.

BACKGROUND OF THE INVENTION

1. Field of the Invention

The present invention relates to an acoustic wave device.

2. Description of the Related Art

Hitherto, acoustic wave devices have been widely used as filters in mobile phones and so on. Japanese Unexamined Patent Application Publication No. 2019-068309 discloses an example of the acoustic wave devices. In the disclosed acoustic wave device, an IDT (Interdigital Transducer) electrode is disposed on a piezoelectric substrate. The IDT electrode includes a Cu film. Moreover, a silicon oxide film is disposed on the piezoelectric substrate and covers the IDT electrode. A protective film is further disposed on the piezoelectric substrate and covers the IDT electrode to prevent Cu in the Cu film from diffusing into the silicon oxide film.

In an acoustic wave device disclosed in Japanese Unexamined Patent Application Publication No. 2017-157944, an IDT electrode includes a barrier layer disposed on a piezoelectric substrate and a main electrode layer disposed on the barrier layer. The barrier layer is disposed to prevent a metal in the main electrode layer from diffusing into the piezoelectric substrate.

SUMMARY OF THE INVENTION

It is deemed that, when the protective film disclosed in Japanese Unexamined Patent Application Publication No. 2019-068309 is disposed on the piezoelectric substrate to cover the IDT electrode disclosed in Japanese Unexamined Patent Application Publication No. 2017-157944, the metal forming the IDT electrode can be suppressed from diffusing into the silicon oxide film and the piezoelectric substrate. However, the inventors discovered that there is a possibility of the metal diffusing into the piezoelectric substrate through a path formed at a boundary between a side surface of the barrier layer and the protective film.

Preferred embodiments of the present invention provide acoustic wave devices each capable of more reliably reducing or preventing diffusion of Cu of an IDT electrode into a piezoelectric substrate.

A preferred embodiment of the present invention provides an acoustic wave device including a piezoelectric substrate, and an IDT electrode including a plurality of electrode fingers, an outer layer on the piezoelectric substrate, and an electrode layer on the outer layer and including Cu as a main component; wherein the electrode layer includes a first principal surface positioned on a side closest to the piezoelectric substrate, a second principal surface opposite to the first principal surface, and a side surface connected to the first principal surface and the second principal surface, the outer layer covers the first principal surface and the side surface of the electrode layer, and a thickness of a portion of the outer layer covering the first principal surface of the electrode layer is smaller than a thickness of a portion of the outer layer covering the side surface of the electrode layer.

With the acoustic wave devices according to preferred embodiments of the present invention, Cu of the IDT electrode can be more reliably reduced or prevented from diffusing into the piezoelectric substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified from the following description of practical preferred embodiments of the present invention with reference to the drawings.

It is to be noted that the preferred embodiments described in this Description are merely illustrative, and that configurations in the different preferred embodiments can be partially replaced therebetween or combined with each other.

Figure 1:
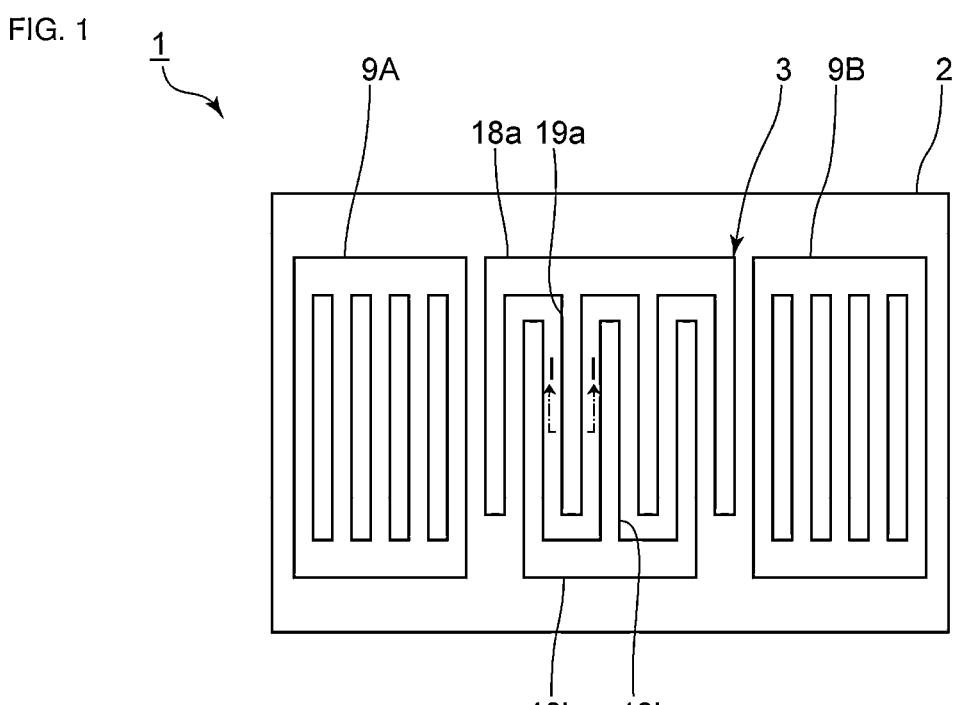
FIG. 1 is a plan view of an acoustic wave device according to a first preferred embodiment of the present invention.

FIG. 1 is a plan view of an acoustic wave device according to a first preferred embodiment of the present invention.

The acoustic wave device 1 includes a piezoelectric substrate 2. The piezoelectric substrate 2 in this preferred embodiment is a piezoelectric substrate formed of only a piezoelectric layer. The piezoelectric substrate 2 is made of lithium niobate. In this Description, the wording "the piezoelectric substrate 2 is made of lithium niobate" includes the case in which the piezoelectric substrate 2 contains a trace amount of impurities. The above point is similarly applied to relations between other components of the acoustic wave devices according to preferred embodiments of the present invention and materials of those components. In more detail, the piezoelectric substrate 2 is made of 128° rotated Y cut X SAW propagation $LiNbO_3$. However, the cut angle and the material of the piezoelectric substrate 2 are not limited to the above-mentioned examples. In another example, lithium tantalate, zinc oxide, aluminum nitride, quartz, PZT (Pb $(Zr—Ti)O_3$), or the like can also be used as the material of the piezoelectric substrate 2. The piezoelectric substrate 2 may be a multilayer substrate including a piezoelectric layer.

The IDT electrode 3 is disposed on the piezoelectric substrate 2. The IDT electrode 3 includes a first busbar 18*a*, a second busbar 18*b*, a plurality of first electrode fingers 19*a*, and a plurality of second electrode fingers 19*b*. The first busbar 18*a* and the second busbar 18*b* are opposite to each other. One end of each of the first electrode fingers 19*a* is connected to the first busbar 18*a*. One end of each of the second electrode fingers 19*b* is connected to the second busbar 18*b*. The first electrode fingers 19*a* and the second electrode fingers 19*b* are interdigitated with each other. A wavelength specified by an electrode finger pitch of the IDT electrode 3 is assumed to be denoted by λ. The term "electrode finger pitch" indicates a center-to-center distance between adjacent two of the electrode fingers. When the IDT electrode 3 includes portions in which the center-to-center distances are different, the electrode finger pitch may be given by an average value of the different center-to-center distances.

When an AC voltage is applied to the IDT electrode 3, an acoustic wave is excited. A pair of reflectors 9A and 9B is disposed on the piezoelectric substrate 2 on both sides of the IDT electrode 3 in a propagation direction of the acoustic wave. Thus, the acoustic wave device 1 according to this preferred embodiment is a surface acoustic wave resonator. Alternatively, the acoustic wave devices according to preferred embodiments of the present invention may be a boundary acoustic wave resonator. The acoustic wave devices according to preferred embodiments of the present invention is not limited to an acoustic wave resonator and may be a filter device or a multiplexer each including the acoustic wave resonator.

Figure 2:
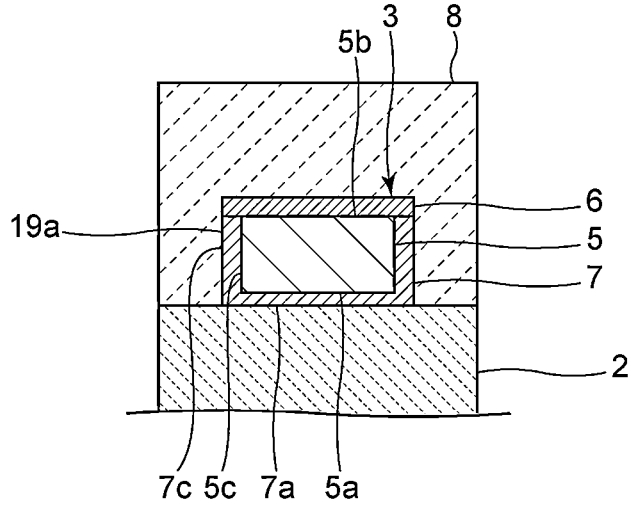
FIG. 2 is a sectional view, taken along a line I-I in FIG. 1, of an electrode finger.

FIG. 2 is a sectional view, taken along a line I-I in FIG. 1, of the electrode finger.

The IDT electrode 3 includes a barrier layer 7, a first layer 5, and a second layer 6. The barrier layer 7 is an outer layer, for example. In more detail, the barrier layer 7 is disposed on the piezoelectric substrate 2. The first layer 5 is disposed on the barrier layer 7. The second layer 6 is disposed on the first layer 5.

The first layer 5 is an electrode layer, for example. The first layer 5 has a first principal surface 5*a*, a second principal surface 5*b*, and a side surface 5*c*. The first principal surface 5*a* and the second principal surface 5*b* are opposite to each other. The first principal surface 5*a* is in contact with the barrier layer 7. The second principal surface 5*b* is in contact with the second layer 6. The side surface 5*c* is connected to the first principal surface 5*a* and the second principal surface 5*b*. The first layer 5 contains Cu as a main component. In this Description, the term "main component" indicates a component with the content of more than 50%. The first layer 5 is preferably made of Cu.

The second layer 6 is made of Ti. The material of the second layer 6 is not limited to the above-mentioned example. In another example, the second layer 6 may be formed of a multilayer body.

The barrier layer 7 is positioned between the piezoelectric substrate 2 and the first layer 5. Thus, the barrier layer 7 covers the first principal surface 5*a* of the first layer 5. The barrier layer 7 further covers the side surface 5*c* of the first layer 5. The barrier layer 7 includes a first portion 7*a* and a second portion 7*c*. The first portion 7*a* is a portion covering the first principal surface 5*a* of the first layer 5. The second portion 7*c* is a portion covering the side surface 5*c* of the first layer 5. In this preferred embodiment, a thickness of the first portion 7*a* of the barrier layer 7 is smaller than that of the second portion 7*c* of the barrier layer 7.

In this preferred embodiment, the barrier layer 7 is made of an oxide of Mn. However, the barrier layer 7 simply needs to be made of a metal oxide. The barrier layer 7 is preferably made of an oxide of one metal selected from the group consisting of Mn, Al, Mg, and Sn.

A protective film 8 is disposed on the piezoelectric substrate 2 and covers the IDT electrode 3. The protective film 8 is made of silicon oxide. In more detail, the protective film 8 is made of $SiO_2$. However, the material of the protective film 8 is not limited to the above-mentioned example and may be made of, for example, silicon oxynitride.

Some unique features of this preferred embodiment are that the barrier layer 7 covers the first principal surface 5*a* and the side surface 5*c* of the first layer 5 and, in the barrier layer 7, the first portion 7*a* has the smaller thickness than the second portion 7*c*. With such features, Cu of the IDT electrode 3 can be more reliably prevented from diffusing into the piezoelectric substrate 2 while reduction of an electromechanical coupling coefficient is reduced or prevented. In addition, the above-mentioned Cu can be effectively reduced or prevented from diffusing into the protective film 8. Advantageous effects of various preferred embodiments of the present invention will be described in more detail below.

Figure 3:
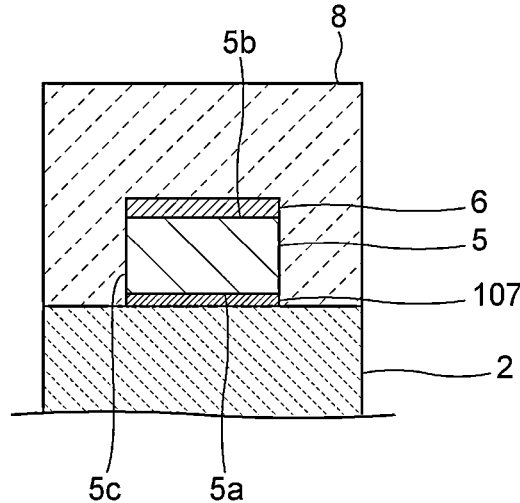
FIG. 3 is a transverse sectional view of an electrode finger in a first comparative example.
Figure 4:
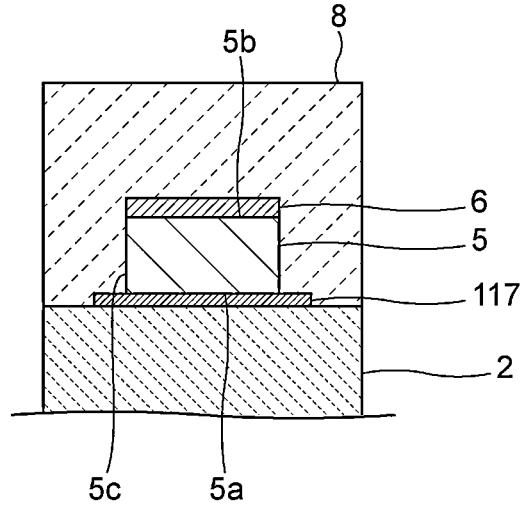
FIG. 4 is a transverse sectional view of an electrode finger in a second comparative example.

A sample of the acoustic wave device 1 according to the first preferred embodiment was prepared. Furthermore, a sample of an acoustic wave filter device of an acoustic wave device according to a first comparative example and a sample of an acoustic wave filter device of an acoustic wave device according to a second comparative example were prepared. A plurality of acoustic wave filter devices was prepared for each type of the above-mentioned acoustic wave filter devices. As illustrated in FIG. 3, the acoustic wave device according to the first comparative example is different from the acoustic wave device according to the first preferred embodiment in that the IDT electrode does not include the barrier layer and a NiCr layer 107 is disposed between the piezoelectric substrate 2 and the first layer 5. As illustrated in FIG. 4, the second comparative example is also different from the first preferred embodiment in that the IDT electrode does not include the barrier layer and a NiCr layer 117 is disposed between the piezoelectric substrate 2 and the first layer 5. Moreover, in the second comparative example, the NiCr layer 117 has a greater width than the first layer 5. This configuration is similar to that disclosed in Japanese Unexamined Patent Application Publication No. 2017-157944. Here, a width of the electrode finger indicates a size of the electrode finger along the propagation direction of the acoustic wave.

Design parameters of the acoustic wave device according to the first preferred embodiment are as follows.
Material of the piezoelectric substrate 2; 128° rotated Y cut X SAW propagation $LiNbO_3$
    First layer 5; material . . . Cu, thickness . . . 300 nm
    Second layer 6; material . . . Ti, thickness . . . 8 nm Barrier layer 7; material . . . oxide of Mn, thickness of the first portion 7a . . . 2 nm, thickness of the second portion 7c . . . 15 nm Protective film 8; material . . . $SiO_2$, thickness . . . 1110 nm Wavelength $\lambda$ in the IDT electrode 3; 4 $\mu$m Design parameters of the acoustic wave devices according to the first comparative example and the second comparative example are as follows.

Material of the piezoelectric substrate; 128° rotated Y cut X SAW propagation $LiNbO_3$ thickness of the NiCr layer: 6 nm First layer; material . . . Cu, thickness . . . 300 nm Second layer; material . . . Ti, thickness . . . 8 nm Wavelength $\lambda$ in the IDT electrode; 4 $\mu$m A high temperature loading test was carried out on the sample of the first preferred embodiment, the sample of the acoustic wave filter device of the first comparative example, and the sample of the acoustic wave device according to the second comparative example. In the test, temperature was set to 125° C., and a DC voltage of 3 V was applied between the first busbar and the second busbar of the IDT electrode. Filter electrical characteristics were measured at intervals of a predetermined time in the above-mentioned state.

As a result of carrying out the high temperature loading test, with respect to the first comparative example, deterioration of insertion loss was found in all samples in the measurement after a test time of 200 hours. With respect to the second comparative example, deterioration of the insertion loss was found in some of samples in the measurement after a test time of 200 hours. In the other samples of the second comparative example, deterioration of an insulation resistance value was confirmed. As a result of observing the electrode fingers of the samples for which the deterioration of the insulation resistance value was confirmed, diffusion of Cu in the first layer 5 into $LiNbO_3$ in the piezoelectric substrate 2 was confirmed. In other words, the structure disclosed in Japanese Unexamined Patent Application Publication No. 2017-157944 can suppress the diffusion of Cu into $LiNbO_3$ to some extent, but it cannot provide a sufficient effect meeting the market demand.

By contrast, in the sample of the acoustic wave filter device 1 according to the first preferred embodiment, no deterioration was found in both the insertion loss and the insulation resistance value even after a test time of 1000 hours.

The first portion 7a of the barrier layer 7 has the function of mainly reducing or preventing the diffusion of Cu in the first layer 5 into the piezoelectric substrate 2 and further functions as a close adhesion layer between the first layer 5 and the piezoelectric substrate 2 at the same time. The metal oxide forming the barrier layer 7 is an insulator. With the insulator arranged between the electrode layer of the IDT electrode 3 and the piezoelectric substrate 2, the electromechanical coupling coefficient is reduced. In this preferred embodiment, however, the portion of the barrier layer 7 positioned between the first layer 5 and the piezoelectric substrate 2 is thin. Accordingly, reduction of the electromechanical coupling coefficient can be reduced or prevented.

The diffusion between the first layer 5 and the piezoelectric substrate 2 can be reduced or prevented even by the relatively thin barrier layer 7, while the diffusion between the first layer 5 and the protective film 8 is difficult to reduce or prevent by the relatively thin barrier layer. In this preferred embodiment, however, the first portion 7a has the smaller thickness than the second portion 7c in the barrier layer 7. Accordingly, Cu in the first layer 5 can be more reliably reduced or prevented from diffusing into the protective film 8.

Furthermore, the IDT electrode 3 generally has a structure with a greater width in a planar direction than in a thickness direction. By setting the thickness of the first portion 7a to be smaller than that of the second portion 7c in the barrier layer 7, reduction of a cross-sectional area of Cu with small resistivity can be made smaller. As a result, the electrical resistance of the electrode finger can be reduced.

As seen from the above-described discussion, the barrier layer 7 is desirably formed such that the first portion 7a has the smaller thickness than the second portion 7c. With that feature, it is possible to obtain the acoustic wave device 1 which has good reliability, in which the loss is relatively small because the electrode finger has smaller electrical resistance, and which has the high electromechanical coupling coefficient.

The thickness of the first portion 7a of the barrier layer 7 is desirably within a range of about 0.5 nm or more and about 10 nm or less, for example. If the thickness of the first portion 7a is less than about 0.5 nm, there is a possibility that it becomes difficult for the barrier layer 7 to reduce or prevent the diffusion of Cu in the first layer 5 into the piezoelectric substrate 2. On the other hand, if the thickness of the first portion 7a is more than about 10 nm, there is a possibility that the reduction of the electromechanical coupling coefficient is hard to reduce or prevent, and the insertion loss of the device increases.

The thickness of the second portion 7c of the barrier layer 7 is desirably within a range of about 10 nm or more and about 20 nm or less, for example. If the thickness of the second portion 7c is less than about 10 nm, there is a possibility that barrier performance becomes insufficient, and that the diffusion of Cu is hard to reduce or prevent. On the other hand, if the thickness of the second portion 7c is more than about 20 nm, a ratio of the barrier layer 7 to a cross-sectional area of the electrode finger increases, and a percentage of the first layer 5 reduces. Accordingly, electrical resistance of the electrode finger increases.

As in this preferred embodiment, the second layer 6 is preferably disposed on the first layer 5. In this case, the first layer 5 is covered by the barrier layer 7 and the second layer 6 along its outer periphery. Accordingly, Cu in the first layer 5 can be effectively prevented from diffusing into the protective film 8. In addition, oxidation of Cu in the first layer 5 can be reduced or prevented.

A non-limiting example of a method of manufacturing the acoustic wave device 1 according to the first preferred embodiment will be described below. At the outset, an electrode pattern for the first layer 5 and the second layer 6 are formed on the piezoelectric substrate 2 by the liftoff process, for example. The electrode pattern for the first layer 5 is formed of a metal that is obtained by adding 0.1 atom % to 20 atom % of Mn to Cu. Alternatively, the electrode pattern for the first layer 5 and the second layer 6 may be formed by patterning with etching of each of those metal layers.

Then, heat treatment is performed for about 1 hour at 200° C. to 400° C. During the heat treatment, Mn in the electrode pattern binds to oxygen in an atmosphere at a side surface of the electrode pattern, thus forming an oxide film. Furthermore, Mn in the electrode pattern binds to oxygen in the piezoelectric substrate 2 at a bottom surface of the electrode pattern, thus forming an oxide film. On the other hand, an upper surface of the electrode pattern is covered by the second layer 6. Accordingly, oxidation of Mn does not progress there. The wording "bottom surface" indicates a lower surface as viewed in FIG. 2. The wording "upper surface" indicates an upper surface as viewed in FIG. 2. With the oxidation of Mn, Mn in the electrode pattern additionally migrates to the bottom surface and the side surface of the electrode pattern. Then, the oxidation of Mn further progresses. As a result, the first layer 5 constituted as a Cu layer is formed from the electrode pattern made of a mixture of Cu and Mn. In addition, the barrier layer 7 made of an oxide of Mn is formed on the first principal surface 5a and the side surface 5c of the first layer 5. The barrier layer 7 is not formed directly in an electrode-finger not-formed region, such as a zone between the electrode fingers on the piezoelectric substrate 2. At the same time as forming the IDT electrode 3, the reflector 9A and the reflector 9B are also formed. Thereafter, the protective film 8 is formed on the piezoelectric substrate 2 to cover the IDT electrode 3 by the sputtering process, for example.

Prior to performing the above-described heat treatment, namely in a state in which a small amount of Mn is mixed in the Cu layer forming the electrode pattern, resistivity of the Cu layer is high, and a barrier performance for the diffusion of Cu is not yet developed. The barrier performance is developed with Mn migrating outward due to the heat treatment and forming the oxide film. Thus, a Mn concentration in a central Cu portion reduces, and the central Cu portion becomes nearly pure Cu. As a result, the resistivity of the Cu layer reduces, and the advantageous effects of this application are obtained.

The first layer 5 simply needs to contain Cu as a main component, and Mn may remain in the first layer 5. The concentration of Mn in the first layer 5 is preferably about 0.02 atm % or less, for example. In this case, an increase in resistivity of the first layer 5 in comparison with that of pure Cu can be held relatively small. However, as described above, the first layer 5 is preferably made of Cu containing no impurities. In such a case, the resistivity of the first layer 5 can be further reduced.

As metal elements migrating like Mn and forming stable oxide films, there are, for example, Al, Mg, and Sn. Among those examples, the metal element capable of significantly reducing or minimizing the electrical resistance of the electrode finger when added to Cu to form the barrier layer 7 is Mn. In the case of adding Ag as the metal element other than the above-described examples, the electric power handling capacity of the IDT electrode 3 can be increased.

When the protective film 8 is made of an oxide such as $SiO_2$, the above-described heat treatment may be performed after forming the protective film 8 instead of after forming the electrode pattern. In that case, Mn forms the oxide film by binding to oxygen in the protective film 8 instead of an atmosphere.

Figure 5:
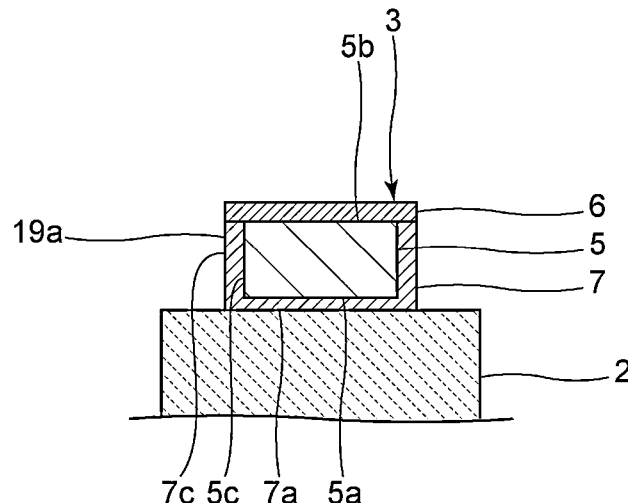
FIG. 5 is a transverse sectional view of an electrode finger in a modification of the first preferred embodiment of the present invention.

The protective film 8 is not always needed to be formed. In a modification of the first preferred embodiment illustrated in FIG. 5, the protective film 8 is not formed on the piezoelectric substrate 2. In this case, the diffusion of Cu in the first layer 5 into the piezoelectric substrate 2 can also be more reliably reduced or prevented as in the first preferred embodiment.

Figure 6:
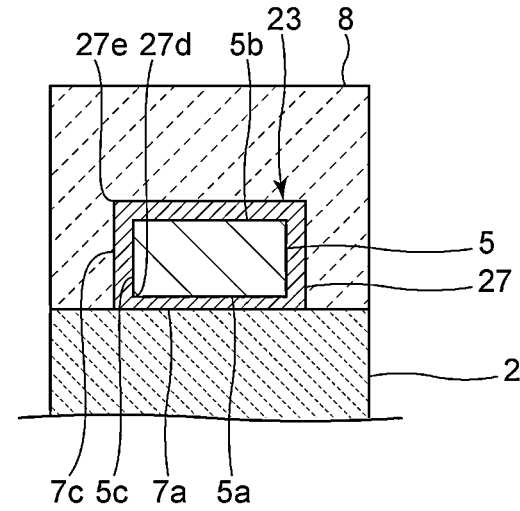
FIG. 6 is a transverse sectional view of an electrode finger in a second preferred embodiment of the present invention.

FIG. 6 is a transverse sectional view of an electrode finger in a second preferred embodiment.

This preferred embodiment is different from the first preferred embodiment in that a barrier layer 27 covers the first principal surface 5a, the second principal surface 5b, and the side surface 5c of the first layer 5 in an IDT electrode 23, and that the second layer 6 is not disposed. Except for the above-mentioned point, an acoustic wave device according to this preferred embodiment has a similar configuration to that of the acoustic wave device 1 according to the first preferred embodiment.

Since the barrier layer 27 covers the side surface 5c and the second principal surface 5b of the first layer 5, Cu in the first layer 5 can be prevented from diffusing into the protective film 8. Furthermore, since the barrier layer 27 covers the first principal surface 5a of the first layer 5, the diffusion of Cu in the first layer 5 into the piezoelectric substrate 2 can be more reliably reduced or prevented as in the first preferred embodiment.

In forming the IDT electrode 23 in this preferred embodiment, the heat treatment is performed, for example, in a similar manner to that in forming the IDT electrode 3 in the first preferred embodiment except that the second layer 6 is not disposed. During the heat treatment, Mn in the electrode pattern for the first layer 5 binds to oxygen in an atmosphere at the side surface and the upper surface of the electrode pattern, thus forming an oxide film. Furthermore, Mn in the electrode pattern binds to oxygen in the piezoelectric substrate 2 at the bottom surface of the electrode pattern, thus forming an oxide film. With oxidation of Mn, Mn in the electrode pattern additionally migrates to the bottom surface, the side surface, and the upper surface of the electrode pattern. Then, the oxidation of Mn further progresses. As a result, the first layer 5 constituted as a Cu layer is formed from the electrode pattern made of a mixture of Cu and Mn. In addition, the barrier layer 27 made of an oxide of Mn is formed on the first principal surface 5a, the side surface 5c, and the second principal surface 5b of the first layer 5.

As illustrated in FIG. 6, the barrier layer 27 includes a first connection portion 27d and a second connection portion 27e. In more detail, the first connection portion 27d is a portion where a portion of the barrier layer 27 disposed on the side surface 5c of the first layer 5 and a portion of the barrier layer 27 disposed on the first principal surface 5a are connected to each other. The second connection portion 27e is a portion where a portion of the barrier layer 27 disposed on the side surface 5c of the first layer 5 and a portion of the barrier layer 27 disposed on the second principal surface 5b are connected to each other. In this preferred embodiment, each of the first connection portion 27d and the second connection portion 27e has a shape defined by two linear lines joining with each other when viewed in a transverse cross-section of the IDT electrode 23. Thus, the first connection portion 27d and the second connection portion 27e are formed as angled corner portions. More specifically, the first connection portion 27d is formed as the angled corner portion at each of a boundary between the barrier layer 27 and the protective film 8 and a boundary between the barrier layer 27 and the first layer 5. The second connection portion 27e is also similarly formed as the angled corner portion at each of the above-mentioned two boundaries.

Figure 7:
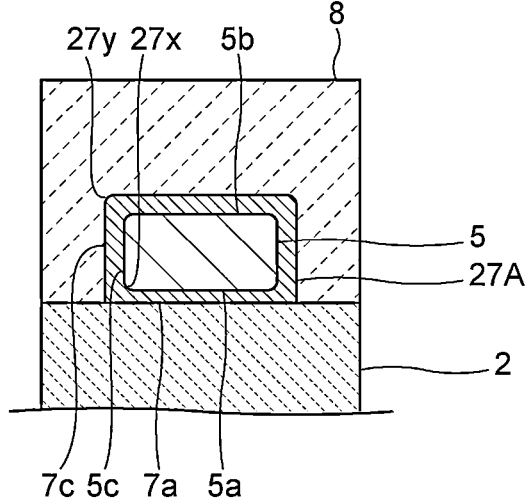
FIG. 7 is a transverse sectional view of an electrode finger in a modification of the second preferred embodiment of the present invention.

However, the shapes of the first connection portion 27d and the second connection portion 27e are not limited to the above-mentioned example. In a modification of the second preferred embodiment illustrated in FIG. 7, a first connection portion 27x and a second connection portion 27y of a barrier layer 27A has a curved shape. In more detail, the second connection portion 27y has a curved shape at each of a boundary between the barrier layer 27A and the protective film 8 and a boundary between the barrier layer 27A and the first layer 5. The first connection portion 27x is formed as an angled corner portion at a boundary between the barrier layer 27A and the protective film 8. At a boundary between the barrier layer 27A and the first layer 5, however, the first connection portion 27x has a curved shape.

Figure 8:
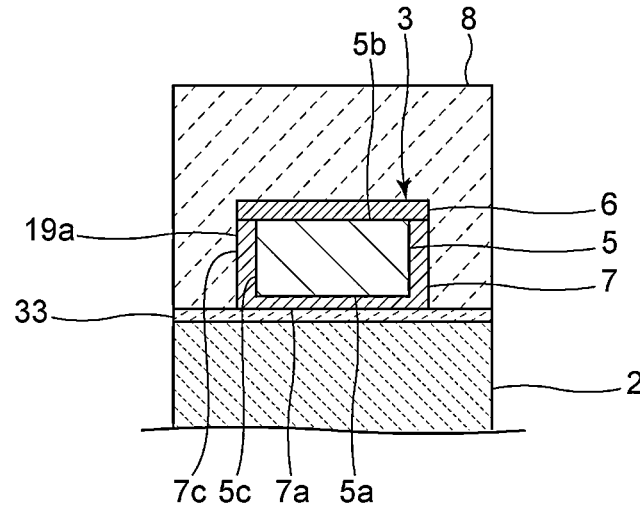
FIG. 8 is a transverse sectional view of an electrode finger in a third preferred embodiment of the present invention.

FIG. 8 is a transverse sectional view of an electrode finger in a third preferred embodiment.

This preferred embodiment is different from the first preferred embodiment in that a dielectric film 33 is disposed between the piezoelectric substrate 2 and the IDT electrode 3. Except for the above-mentioned point, an acoustic wave device according to this preferred embodiment has a similar configuration to that of the acoustic wave device 1 according to the first preferred embodiment.

With the presence of the dielectric film 33, the electro-mechanical coupling coefficient can be adjusted to a proper value, and the diffusion of Cu in the first layer 5 into the piezoelectric substrate 2 can be effectively reduced or prevented. A thickness of the dielectric film 33 is preferably about 1% or less of the wavelength λ, for example. Under this condition, the electromechanical coupling coefficient can be prevented from becoming too small. Accordingly, the insertion loss is hard to increase.

Figure 9:
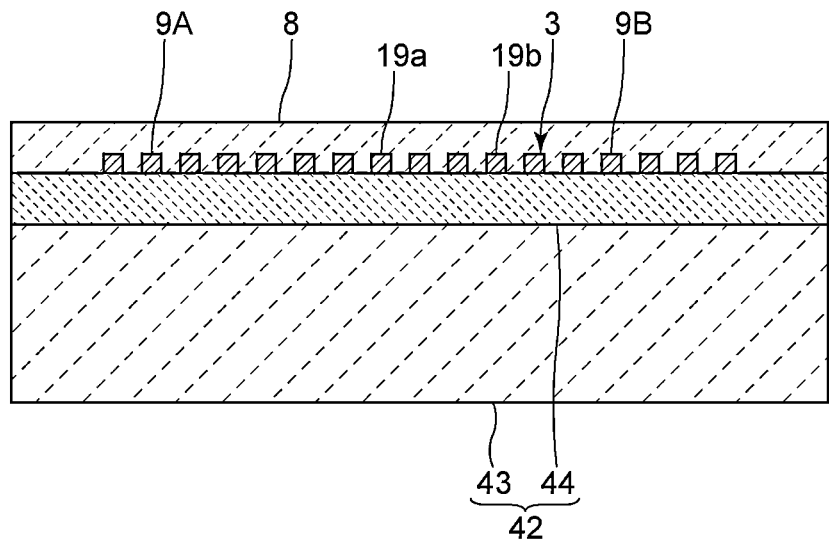
FIG. 9 is a front sectional view of an acoustic wave device according to a fourth preferred embodiment of the present invention.

FIG. 9 is a front sectional view of an acoustic wave device according to a fourth preferred embodiment.

This preferred embodiment is different from the first preferred embodiment in that a piezoelectric substrate 42 is a multilayer substrate including a support substrate 43 and a piezoelectric layer 44. The piezoelectric layer 44 is disposed on the support substrate 43. The IDT electrode 3 is disposed on the piezoelectric layer 44. Except for the above-mentioned point, the acoustic wave device according to this preferred embodiment has a similar configuration to that of the acoustic wave device 1 according to the first preferred embodiment.

The piezoelectric layer 44 is made of lithium niobate. However, the material of the piezoelectric layer 44 is not limited to the above-mentioned example and can also be selected from among, for example, lithium tantalate, zinc oxide, aluminum nitride, quartz, and PZT.

The support substrate 43 is made of silicon. However, the material of the support substrate 43 is not limited to the above-mentioned example and can also be selected from among, for example, piezoelectric bodies such as aluminum oxide, lithium tantalate, lithium niobate, and quartz, a variety of ceramics such as alumina, sapphire, magnesia, silicon nitride, aluminum nitride, silicon carbide, zirconia, cordierite, mullite, steatite, and forsterite, dielectrics such as diamond and glass, semiconductors such as gallium nitride, and resins.

In this preferred embodiment as well, the IDT electrode 3 has a similar configuration to that in the first preferred embodiment. Accordingly, the diffusion of Cu of the IDT electrode 3 into the piezoelectric substrate 42 and the protective film 8 can be more reliably reduced or prevented. A thickness of the piezoelectric layer 44 is preferably 1λ or less. In this case, excitation efficiency of the acoustic wave can be increased.

Figure 10:
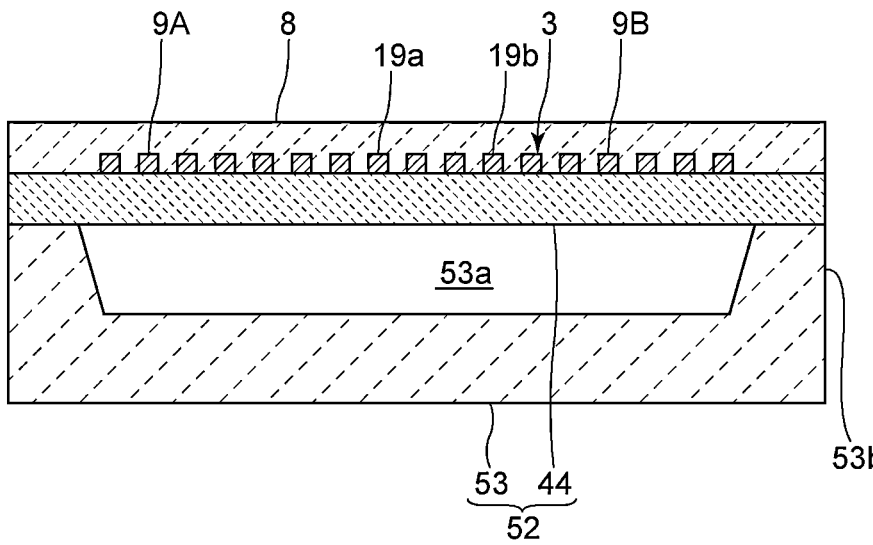
FIG. 10 is a front sectional view of an acoustic wave device according to a fifth preferred embodiment of the present invention.

FIG. 10 is a front sectional view of an acoustic wave device according to a fifth preferred embodiment.

This preferred embodiment is different from the fourth preferred embodiment in that a support substrate 53 includes a cavity 53a and a support portion 53b. Except for the above-mentioned point, the acoustic wave device according to the fifth preferred embodiment has a similar configuration to that of the acoustic wave device according to the fourth preferred embodiment.

The cavity 53a in the support substrate 53 is surrounded by the support portion 53b and is opened toward the piezoelectric layer 44. The support substrate 53 supports the piezoelectric layer 44 at the support portion 53b. In this case, the excitation efficiency of the acoustic wave can be effectively increased.

In this preferred embodiment, the IDT electrode 3 has a similar configuration to that in the fourth preferred embodiment. Accordingly, the diffusion of Cu of the IDT electrode 3 into the piezoelectric substrate 52 and the protective film 8 can be more reliably reduced or prevented.

Figure 11:
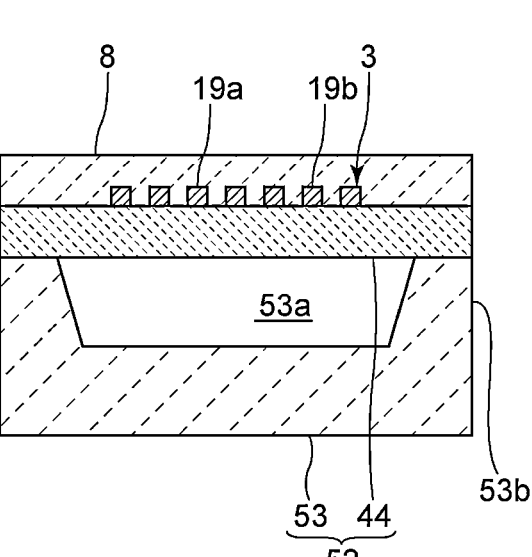
FIG. 11 is a front sectional view of an acoustic wave device according to a sixth preferred embodiment of the present invention.

FIG. 11 is a front sectional view of an acoustic wave device according to a sixth preferred embodiment.

This preferred embodiment is different from the fifth preferred embodiment in that the acoustic wave device 61 utilizes a bulk wave in a thickness-shear primary mode. In more detail, when a thickness of the piezoelectric layer 44 is denoted by d and an electrode finger pitch of the IDT electrode 3 is denoted by p, d/p is about 0.5 or less in this preferred embodiment, for example. With such a configuration, the bulk wave in the thickness-shear primary mode can be utilized as a main mode. The acoustic wave device 61 includes no reflectors. Except for the above-mentioned point, the acoustic wave device 61 according to this preferred embodiment has a similar configuration to that of the acoustic wave device according to the fifth preferred embodiment.

In the case of utilizing the bulk wave in the thickness-shear primary mode, propagation loss is small even when the number of electrode fingers in a reflector is reduced. Therefore, the size of the acoustic wave device 61 can be effectively reduced. In addition, since the IDT electrode 3 has a similar configuration to that in the fifth preferred embodiment, the diffusion of Cu of the IDT electrode 3 into the piezoelectric substrate 52 and the protective film 8 can be more reliably suppressed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate; and
   an IDT electrode including a plurality of electrode fingers, an outer layer on the piezoelectric substrate, and an electrode layer on the outer layer and including Cu as a main component; wherein
   the electrode layer includes a first principal surface positioned on a side closest to the piezoelectric substrate, a second principal surface opposite to the first principal surface, and a side surface connected to the first principal surface and the second principal surface;
   the outer layer covers the first principal surface and the side surface of the electrode layer; and
   a thickness of a portion of the outer layer covering the first principal surface of the electrode layer is smaller than a thickness of a portion of the outer layer covering the side surface of the electrode layer.

2. The acoustic wave device according to claim 1, further comprising a protective film on the piezoelectric substrate and covering the IDT electrode.

3. The acoustic wave device according to claim 1, wherein the electrode layer is a first layer of the IDT electrode, and the IDT electrode further includes a second layer on the second principal surface of the first layer.

4. The acoustic wave device according to claim 2, wherein the electrode layer is a first layer of the IDT electrode, and the IDT electrode further includes a second layer on the second principal surface of the first layer.

5. The acoustic wave device according to claim 1, wherein the outer layer covers the first principal surface, the side surface, and the second principal surface of the electrode layer.

6. The acoustic wave device according to claim 2, wherein the outer layer covers the first principal surface, the side surface, and the second principal surface of the electrode layer.

7. The acoustic wave device according to claim 1, wherein the outer layer is made of a metal oxide.

8. The acoustic wave device according to claim 2, wherein the outer layer is made of a metal oxide.

9. The acoustic wave device according to claim 3, wherein the outer layer is made of a metal oxide.

10. The acoustic wave device according to claim 5, wherein the outer layer is made of a metal oxide.

11. The acoustic wave device according to claim 7, wherein the outer layer is made of an oxide of one metal selected from the group consisting of Mn, Al, Mg, and Sn.

12. The acoustic wave device according to claim 8, wherein the outer layer is made of an oxide of one metal selected from the group consisting of Mn, Al, Mg, and Sn.

13. The acoustic wave device according to claim 9, wherein the outer layer is made of an oxide of one metal selected from the group consisting of Mn, Al, Mg, and Sn.

14. The acoustic wave device according to claim 10, wherein the outer layer is made of an oxide of one metal selected from the group consisting of Mn, Al, Mg, and Sn.

15. The acoustic wave device according to claim 11, wherein the outer layer is made of the oxide of Mn.

16. The acoustic wave device according to claim 12, wherein the outer layer is made of the oxide of Mn.

17. The acoustic wave device according to claim 13, wherein the outer layer is made of the oxide of Mn.

18. The acoustic wave device according to claim 14, wherein the outer layer is made of the oxide of Mn.

19. The acoustic wave device according to claim 1, wherein the piezoelectric substrate includes a support substrate and a piezoelectric layer on the support substrate.

20. The acoustic wave device according to claim 1, further comprising a dielectric film between the piezoelectric substrate and the IDT electrode; wherein when a wavelength specified by an electrode finger pitch of the IDT electrode is denoted by $\lambda$, a thickness of the dielectric film is about 1% or less of the wavelength $\lambda$.

* * * * *